United States Patent
Li et al.

(10) Patent No.: US 10,416,482 B2
(45) Date of Patent: Sep. 17, 2019

(54) DISPLAY BRIGHTNESS ADJUSTMENT METHOD

(71) Applicant: WUHAN CHINA STAR OPTOELECTRONICS TECHNOLOGY CO., LTD., Wuhan (CN)

(72) Inventors: Dejiun Li, Wuhan (CN); Haibo Peng, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 141 days.

(21) Appl. No.: 15/311,859

(22) PCT Filed: Aug. 19, 2016

(86) PCT No.: PCT/CN2016/096057
§ 371 (c)(1),
(2) Date: Nov. 17, 2016

(87) PCT Pub. No.: WO2018/014411
PCT Pub. Date: Jan. 25, 2018

(65) Prior Publication Data
US 2018/0180910 A1 Jun. 28, 2018

(30) Foreign Application Priority Data
Jul. 21, 2016 (CN) .......................... 2016 1 0575502

(51) Int. Cl.
*H01L 27/12* (2006.01)
*G02F 1/13* (2006.01)
(Continued)

(52) U.S. Cl.
CPC .......... *G02F 1/1309* (2013.01); *G02F 1/1368* (2013.01); *G02F 1/133512* (2013.01);
(Continued)

(58) Field of Classification Search
CPC .................................................. H01L 27/1259
See application file for complete search history.

(56) References Cited

U.S. PATENT DOCUMENTS 8,264,447 B2   9/2012   Kimura
8,767,137 B2   7/2014   Hiyama et al.
(Continued)

FOREIGN PATENT DOCUMENTS

CN   1735216 A   2/2006
CN   1838220 A   9/2006
(Continued)

*Primary Examiner* — Moazzam Hossain
*Assistant Examiner* — Omar F Mojaddedi
(74) *Attorney, Agent, or Firm* — JMB Davis Ben-David

(57) ABSTRACT

A display brightness adjustment method is provided and includes: deriving a setting color temperature of a displayed image and confirming a proportion of red light, a proportion of green light and a proportion of blue light in the displayed image according to the setting color temperature of the displayed image; setting a red-light transmittance of a red photoresist, a green-light transmittance of a green photoresist and a blue-light transmittance of a blue photoresist; configuring an aperture ratio of a red sub-pixel unit, an aperture ratio of a green sub-pixel unit and an aperture ratio of a blue sub-pixel unit.

8 Claims, 1 Drawing Sheet

(51) Int. Cl.
*G09G 3/36* (2006.01)
*G02F 1/1368* (2006.01)
*G02F 1/1335* (2006.01)

(52) U.S. Cl.
CPC ......... *G02F 1/133514* (2013.01); *G09G 3/36* (2013.01); *G09G 3/3611* (2013.01); *H01L 27/124* (2013.01); *H01L 27/1259* (2013.01); *G02F 2201/40* (2013.01); *G09G 2320/0666* (2013.01); *G09G 2330/021* (2013.01)

(56) References Cited

U.S. PATENT DOCUMENTS

| | | | |
|---|---|---|---|
| 9,607,575 | B2 | 3/2017 | Wang |
| 2009/0040243 | A1* | 2/2009 | Hisada ................. G09G 3/3614 345/690 |
| 2010/0245718 | A1* | 9/2010 | Nishino ............ G02F 1/133514 349/65 |
| 2011/0187953 | A1* | 8/2011 | Hiyama ................ G02F 1/1335 349/42 |
| 2015/0185379 | A1* | 7/2015 | Hui ........................ G02B 5/201 349/106 |

FOREIGN PATENT DOCUMENTS

| | | |
|---|---|---|
| CN | 101477275 A | 7/2009 |
| CN | 101900899 A | 12/2010 |
| CN | 104157261 A | 11/2014 |
| JP | 2010243522 A | 10/2010 |

\* cited by examiner

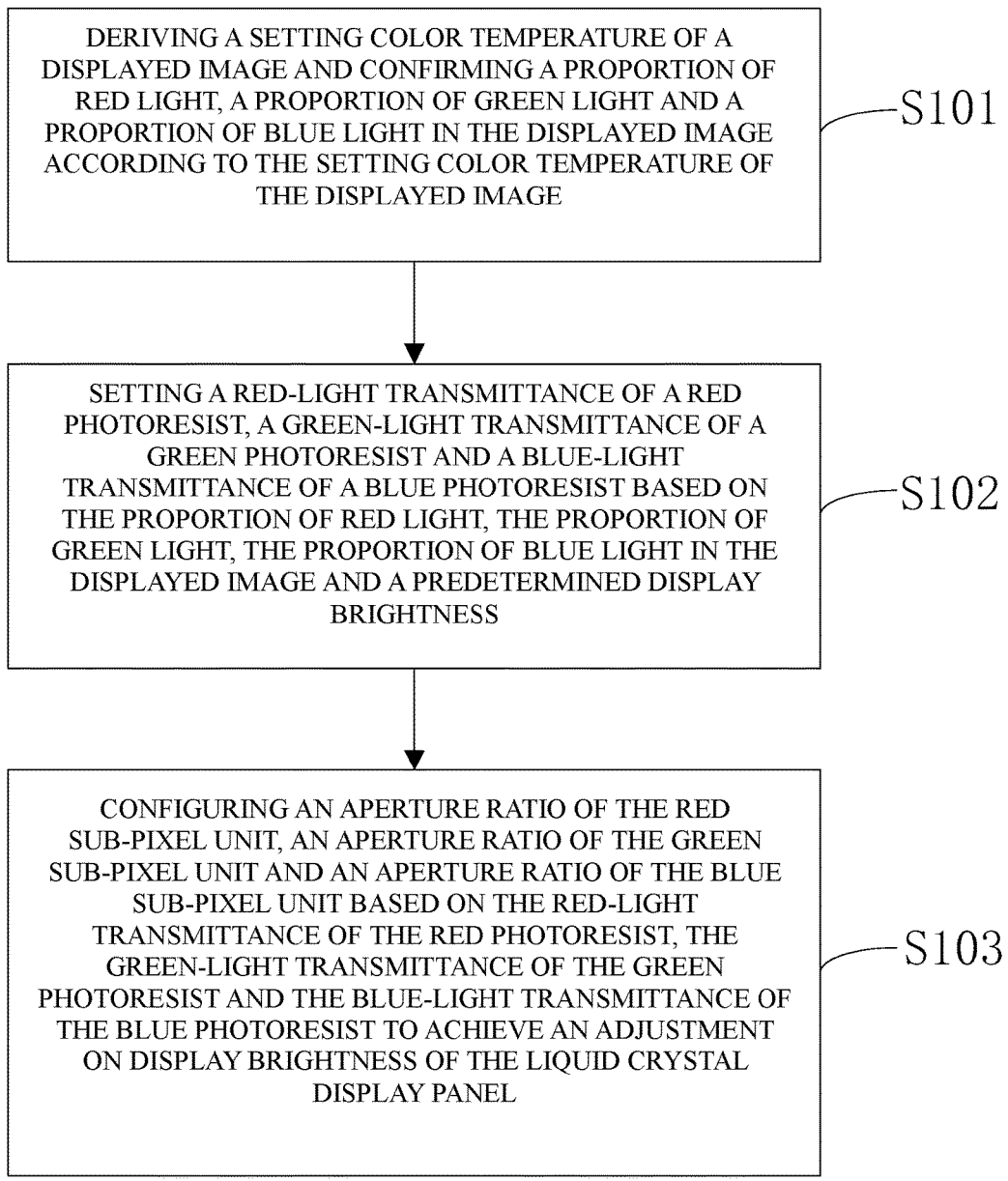

DISPLAY BRIGHTNESS ADJUSTMENT METHOD

CROSS-REFERENCE TO RELATED APPLICATIONS

This is the U.S. National Stage of International Patent Application No. PCT/CN2016/096057, filed Aug. 9, 2016, which in turn claims the benefit of China Patent Application No. 201610575502.6, filed Jul. 21, 2016.

BACKGROUND OF THE INVENTION

Field of the Invention

The present invention relates to the technical field of liquid crystal display technology, and more particularly to a display brightness adjustment method.

Description of the Related Art

With the development of technology, more and more users use all kinds of liquid crystal display panels for work, study, and entertaining activities. Therefore, there is an increasing demand for quality of liquid crystal display panels, such as high resolution, high brightness and high response speed.

With the enhancement of resolution and the increasing numbers of pixels of liquid crystal display, excessive pixels may result in a rapid decrease of aperture ratio of each pixel. In order to maintain the same brightness, manufacturers of liquid crystal display need to increase the power of backlight source at the same time, thereby leading to the increase of power consumption and manufacturing cost of liquid crystal display apparatuses.

Thus, it is necessary to provide a display brightness adjustment method to overcome the problems existing in the conventional technology.

SUMMARY OF THE INVENTION

An objective of the present invention is to provide a display brightness adjustment method that is able to reduce power consumption and manufacturing cost for a liquid crystal display apparatus, so as to solve the technical problem of large power consumption and high manufacturing cost of a conventional liquid crystal display apparatus.

An embodiment of the present invention provides a display brightness adjustment method configured to adjust a display brightness of a corresponding liquid crystal display panel, wherein the liquid crystal display panel includes a plurality of pixel units; each of the pixel units includes a red sub-pixel unit, a green sub-pixel unit and a blue sub-pixel unit, wherein the display brightness adjustment method includes:

deriving a setting color temperature of a displayed image and confirming a proportion of red light, a proportion of green light and a proportion of blue light in the displayed image according to the setting color temperature of the displayed image;

setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness; and configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist to achieve an adjustment on display brightness of the liquid crystal display panel;

wherein the step of setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness includes:

setting the green-light transmittance of the green photoresist based on the proportion of green light in the displayed image and the predetermined display brightness;

setting the blue-light transmittance of the blue photoresist based on the proportion of blue light in the displayed image and the predetermined display brightness; and setting the red-light transmittance of the red photoresist based on the proportion of red light in the displayed image and the predetermined display brightness;

the proportion of red light, the proportion of green light and the proportion of blue light in the displayed image are ranged from 16:50:8 to 17:52:10;

the maximum red-light transmittance of the red photoresist is 16.5% to 17%; the maximum green-light transmittance of the green photoresist is 58% to 60%; the maximum blue-light transmittance of the blue photoresist is 11% to 12%.

In the display brightness adjustment method of the present invention, the step of setting the red-light transmittance of the red photoresist based on the proportion of red light in the displayed image and the predetermined display brightness includes:

setting the red-light transmittance of the red photoresist to the maximum red-light transmittance of the red photoresist when the predetermined display brightness is greater than a threshold value of brightness.

In the display brightness adjustment method of the present invention, the step of configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist includes:

increasing the aperture ratio of the red sub-pixel unit based on the maximum red-light transmittance of the red photoresist, the green-light transmittance of the green photoresist, the blue-light transmittance of the blue photoresist and the proportion of red light in the displayed image.

In the display brightness adjustment method of the present invention, a process of increasing the aperture ratio includes reducing a size of black matrix of the red sub-pixel unit.

In the display brightness adjustment method of the present invention, a process of increasing the aperture ratio includes reducing a line-width of a metal line in the red sub-pixel unit.

In the display brightness adjustment method of the present invention, a process of increasing the aperture ratio includes mounting a thin-film transistor of the red sub-pixel unit in an area of an adjacent green sub-pixel unit.

In the display brightness adjustment method of the present invention, a process of increasing the aperture ratio includes mounting a thin-film transistor of the red sub-pixel unit in an area of an adjacent blue sub-pixel unit.

Another embodiment of the present invention provides a display brightness adjustment method, configured to adjust a display brightness of a corresponding liquid crystal display panel, wherein the liquid crystal display panel includes a plurality of pixel units; each of the pixel units includes a red sub-pixel unit, a green sub-pixel unit and a blue sub-pixel unit; wherein the display brightness adjustment method includes:

deriving a setting color temperature of a displayed image and confirming a proportion of red light, a proportion of green light and a proportion of blue light in the displayed image according to the setting color temperature of the displayed image;

setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness; and configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist to achieve an adjustment on display brightness of the liquid crystal display panel.

In the display brightness adjustment method of the present invention, the step of setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness includes:

setting the green-light transmittance of the green photoresist based on the proportion of green light in the displayed image and the predetermined display brightness;

setting the blue-light transmittance of the blue photoresist based on the proportion of blue light in the displayed image and the predetermined display brightness; and setting the red-light transmittance of the red photoresist based on the proportion of red light in the displayed image and the predetermined display brightness.

In the display brightness adjustment method of the present invention, the step of setting the red-light transmittance of the red photoresist based on the proportion of red light in the displayed image and the predetermined display brightness includes:

setting the red-light transmittance of the red photoresist to the maximum red-light transmittance of the red photoresist when the predetermined display brightness is greater than a threshold value of brightness.

In the display brightness adjustment method of the present invention, the step of configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist includes:

increasing the aperture ratio of the red sub-pixel unit based on the maximum red-light transmittance of the red photoresist, the green-light transmittance of the green photoresist, the blue-light transmittance of the blue photoresist and the proportion of red light in the displayed image.

In the display brightness adjustment method of the present invention, a process of increasing the aperture ratio includes reducing a size of black matrix of the red sub-pixel unit.

In the display brightness adjustment method of the present invention, a process of increasing the aperture ratio includes reducing a line-width of a metal line in the red sub-pixel unit.

In the display brightness adjustment method of the present invention, a process of increasing the aperture ratio includes mounting a thin-film transistor of the red sub-pixel unit in an area of an adjacent green sub-pixel unit.

In the display brightness adjustment method of the present invention, a process of increasing the aperture ratio includes mounting a thin-film transistor of the red sub-pixel unit in an area of an adjacent blue sub-pixel unit.

In the display brightness adjustment method of the present invention, the proportion of red light, the proportion of green light and the proportion of blue light in the displayed image are ranged from 16:50:8 to 17:52:10.

In the display brightness adjustment method of the present invention, the maximum red-light transmittance of the red photoresist is 16.5% to 17%; the maximum green-light transmittance of the green photoresist is 58% to 60%; the maximum blue-light transmittance of the blue photoresist is 11% to 12%.

Comparing with a conventional display brightness adjustment method, the display brightness adjustment method of the present invention configures an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist without the need of enhancing the power of backlight source to adjust display brightness. The operation is simple and convenient. Therefore, the power consumption and manufacturing cost of liquid crystal display apparatus are reduced, and the technical problem of large power consumption and high manufacturing cost of a conventional liquid crystal display apparatus is solved.

In order to make the contents of the present invention more easily understood, the preferred embodiments of the present invention are described in detail in cooperation with accompanying drawings as follows:

BRIEF DESCRIPTION OF THE DRAWINGS

FIG. 1 is a flow chart of a display brightness adjustment method according to a preferred embodiment of the present invention.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, similar structural units are designated by the same reference numerals.

A display brightness adjustment method of the present invention is configured to adjust a display brightness of a corresponding liquid crystal display panel. The liquid crystal display panel includes a plurality of pixel units. Each of the pixel units includes a red sub-pixel unit, a green sub-pixel unit and a blue sub-pixel unit. The display brightness adjustment method of the present invention can configure an aperture ratio of the red sub-pixel unit, an aperture ratio of the green sub-pixel unit and an aperture ratio of the blue sub-pixel unit, respectively, so as to achieve an adjustment on display brightness of the liquid crystal display panel, thereby reducing the power consumption and the manufacturing cost of a liquid crystal apparatus.

With reference to FIG. 1, FIG. 1 is a flow chart of a display brightness adjustment method according to a preferred embodiment of the present invention. The display brightness adjustment method of the preferred embodiment includes the following steps:

step S101 of deriving a setting color temperature of a displayed image and confirming a proportion of red light, a proportion of green light and a proportion of blue light in the displayed image according to the setting color temperature of the displayed image;

step S102 of setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness;

step S103 of configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist to achieve an adjustment on display brightness of the liquid crystal display panel.

The following will describe the specific process for each step of the display brightness adjustment method of the preferred embodiment.

In step S101, the liquid crystal display panel derives a setting color temperature of a displayed image which is set by a user. Through the setting color temperature of the displayed image, a proportion of red light, a proportion of green light and a proportion of blue light in the displayed image can be obtained. For example, a mobile phone display product may has a setting color temperature of 6500K to 7500K, wherein the proportion of red light, the proportion of green light and the proportion of blue light in the displayed image are 16.5:51:9. Then turn to step S102.

In step S102, the liquid crystal display panel sets a red-light transmittance of a red photoresist, a green-light transmittance of a green photoresist and a blue-light transmittance of a blue photoresist based on the proportion of red light, the proportion of green light, the proportion of blue light in the displayed image obtained in step101. In a specific embodiment:

the green-light transmittance of the green photoresist may be set according to the proportion of green light in the displayed image and a predetermined display brightness; the blue-light transmittance of the blue photoresist may be set according to the proportion of blue light in the displayed image and the predetermined display brightness; the red-light transmittance of the red photoresist may be set according to the proportion of red light in the displayed image and the predetermined display brightness. Therefore, the proportion of red light, the proportion of green light and the proportion of blue light in the displayed image are controlled by setting parameters of the green photoresist, the blue photoresist and the red photoresist.

However, since the maximum red-light transmittance of the red photoresist in a conventional technology is 16.5% to 17%, the maximum green-light transmittance of the green photoresist is 58% to 60%, and the maximum blue-light transmittance of the blue photoresist is 11% to 12%, when the predetermined display brightness is too high (that is, the predetermined display brightness is greater than a threshold value of brightness), in order to satisfy the proportion of red light, the proportion of green light and the proportion of blue light in the displayed image, the liquid crystal display panel needs to set the red-light transmittance of the red photoresist to the maximum red-light transmittance of the red photoresist so that the red-light transmittance of the red photoresist can match the green-light transmittance of the green photoresist and the blue-light transmittance of the blue photoresist to the greatest extent. Then turn to step S103.

In step S103, the liquid crystal display panel configures the aperture ratio of the red sub-pixel unit, the aperture ratio of the green sub-pixel unit and the aperture ratio of the blue sub-pixel unit based on the red-light transmittance of the red photoresist, the green-light transmittance of the green photoresist and the blue-light transmittance of the blue photoresist obtained from step S102.

If the proportion of red light, the proportion of green light and the proportion of blue light in the displayed image are 16:50:8 to 17:52:10, then the red-light transmittance of the red photoresist is relatively lower in this preferred embodiment. Therefore, it is necessary in this step to increase the aperture ratio of the red sub-pixel unit according to the maximum red-light transmittance of the red photoresist, the green-light transmittance of the green photoresist, the blue-light transmittance of the blue photoresist and the proportion of red light in the displayed image. It is not necessary to increase the aperture ratio of the green sub-pixel unit and the aperture ratio of the blue sub-pixel unit The process of increasing the aperture ratio includes reducing a size of black matrix of the red sub-pixel unit, reducing a line-width of a metal line in the red sub-pixel unit, mounting a thin-film transistor of the red sub-pixel unit in an area of an adjacent green sub-pixel unit, and mounting a thin-film transistor of the red sub-pixel unit in an area of an adjacent blue sub-pixel unit. The metal line herein may be a data line or a scanning line in the red sub-pixel unit.

In a conventional technology, in order to ensure that the setting color temperature of the displayed image does not change, the aperture ratios of the red sub-pixel unit, the green sub-pixel unit and the blue sub-pixel unit tend to be all increased. And the process of increasing the aperture ratios of all is more complicated and the cost thereof is higher.

The liquid crystal display panel of the present preferred embodiment completes the process of adjusting the display brightness by only increasing the aperture ratio of the red sub-pixel unit, and only adjusting related parameters of blue photoresist and green photoresist for the green and blue sub-pixel units so that the setting color temperature of the adjusted displayed image remains does not change. The process of increasing the aperture ratio of a single red sub-pixel unit is relatively simpler and cost less. For example, the process may be mounting a thin-film transistor of the red sub-pixel unit in an area of an adjacent green sub-pixel unit or mounting a thin-film transistor of the red sub-pixel unit in an area of an adjacent blue sub-pixel unit.

Thus, the process of configuring the aperture ratio of each sub-pixel unit of the liquid crystal display panel of the present preferred embodiment is completed, and the process of adjusting the display brightness of the liquid crystal display panel is also completed at the same time.

The display brightness adjustment method of the preferred embodiment configures an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist without the need of enhancing the power of backlight source to adjust display brightness. The operation is simple and convenient. Therefore, the power consumption and manufacturing cost of liquid crystal display apparatus are reduced.

The following will describe the work theory of the display brightness adjustment method of the present invention through a specific embodiment.

1. based on the setting color temperature (6500K to 7500K) of the displayed image, the proportion of red light, the proportion of green light and the proportion of blue light in the displayed image of the liquid crystal display apparatus are set to 16.5:51:9. In a conventional technology, the maximum red-light transmittance of the red photoresist is 17%; the maximum green-light transmittance of the green photoresist is 60%; and the maximum blue-light transmittance of the blue photoresist is 12%.

2. The red-light transmittance of the red photoresist is set to 16.5% (approximately the same as the maximum red-light transmittance of the red photoresist); the green-light transmittance of the green photoresist is set to 51%*1.05=53.55%; and the blue-light transmittance of the blue photoresist is set to 9%*1.05=9.45%.

3. In order to achieve an increase of 5% in the display brightness of the liquid crystal display panel, the aperture ratio of the red sub-pixel unit of the liquid crystal display panel is increased by reducing a size of black matrix of the red sub-pixel unit, reducing a line-width of a metal line in the red sub-pixel unit, so that the aperture ratio of the red sub-pixel unit can be increased by 5%.

Certainly, if the green-light transmittance of the green photoresist in the foregoing second step is set to 51%*1.1=56.1% and the blue-light transmittance of the blue photoresist is set to 9%*1.1=9.9%, then in this step the aperture ratio of the red sub-pixel unit will be increased by 10%.

Thus, the process of configuring the aperture ratio of each sub-pixel unit of the liquid crystal display panel of the present specific embodiment and the process of adjusting the display brightness of the liquid crystal display panel are completed.

The display brightness adjustment method of a liquid crystal display apparatus of the preferred embodiment, without having to increase the power of a backlight source, completes the process of adjusting the display brightness of the liquid crystal display panel by only increasing the aperture ratios of certain sub-pixels. Therefore, the power consumption and manufacturing cost of liquid crystal display apparatus are reduced, and the technical problem of large power consumption and high manufacturing cost of a conventional liquid crystal display apparatus is solved.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A display brightness adjustment method configured to adjust a display brightness of a corresponding liquid crystal display panel, wherein the liquid crystal display panel includes a plurality of pixel units; each of the pixel units includes a red sub-pixel unit, a green sub-pixel unit and a blue sub-pixel unit; wherein the display brightness adjustment method comprises:

deriving a setting color temperature of a displayed image and confirming a proportion of red light, a proportion of green light and a proportion of blue light in the displayed image according to the setting color temperature of the displayed image;

setting a red-light transmittance of a red photoresist, a green-light transmittance of a green photoresist and a blue-light transmittance of a blue photoresist based on the proportion of red light, the proportion of green light, the proportion of blue light in the displayed image and a predetermined display brightness; wherein the red-light transmittance of the red photoresist is set to a maximum red-light transmittance of the red photoresist when the predetermined display brightness is greater than a threshold value of brightness; and configuring an aperture ratio of the red sub-pixel unit, an aperture ratio of the green sub-pixel unit and an aperture ratio of the blue sub-pixel unit based on the red-light transmittance of the red photoresist, the green-light transmittance of the green photoresist and the blue-light transmittance of the blue photoresist to achieve an adjustment on display brightness of the liquid crystal display panel, wherein the aperture ratio of the red sub-pixel unit is increased based on the maximum red-light transmittance of the red photoresist, the green-light transmittance of the green photoresist, the blue-light transmittance of the blue photoresist and the proportion of red light in the displayed image.

2. The display brightness adjustment method as claimed in claim 1, wherein the step of setting the red-light transmittance of the red photoresist, the green-light transmittance of the green photoresist and the blue-light transmittance of the blue photoresist based on the proportion of red light, the proportion of green light, the proportion of blue light in the displayed image and a predetermined display brightness includes:

setting the green-light transmittance of the green photoresist based on the proportion of green light in the displayed image and the predetermined display brightness;

setting the blue-light transmittance of the blue photoresist based on the proportion of blue light in the displayed image and the predetermined display brightness; and setting the red-light transmittance of the red photoresist based on the proportion of red light in the displayed image and the predetermined display brightness.

3. The display brightness adjustment method as claimed in claim 1, wherein a process of increasing the aperture ratio includes reducing a size of black matrix of the red sub-pixel unit.

4. The display brightness adjustment method as claimed in claim 1, wherein a process of increasing the aperture ratio includes reducing a line-width of a metal line in the red sub-pixel unit.

5. The display brightness adjustment method as claimed in claim 1, wherein a process of increasing the aperture ratio includes mounting a thin-film transistor of the red sub-pixel unit in an area of an adjacent green sub-pixel unit.

6. The display brightness adjustment method as claimed in claim 1, wherein a process of increasing the aperture ratio includes mounting a thin-film transistor of the red sub-pixel unit in an area of an adjacent blue sub-pixel unit.

7. The display brightness adjustment method as claimed in claim 1, wherein the proportion of red light, the proportion of green light and the proportion of blue light in the displayed image are ranged from 16:50:8 to 17:52:10.

8. The display brightness adjustment method as claimed in claim 1, wherein the maximum red-light transmittance of the red photoresist is 16.5% to 17%; the maximum green-light transmittance of the green photoresist is 58% to 60%; the maximum blue-light transmittance of the blue photoresist is 11% to 12%.

* * * * *